United States Patent
März et al.

(10) Patent No.: US 10,778,087 B2
(45) Date of Patent: Sep. 15, 2020

(54) METHOD AND SWITCHING ARRANGEMENT FOR CHANGING A SWITCHING STATE OF A SWITCHING HALF-BRIDGE

(71) Applicant: Siemens Aktiengesellschaft, Munich (DE)

(72) Inventors: Andreas März, Leinburg (DE); Mark-Matthias Bakran, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 18 days.

(21) Appl. No.: 16/345,358

(22) PCT Filed: Oct. 16, 2017

(86) PCT No.: PCT/EP2017/076335
§ 371 (c)(1),
(2) Date: Apr. 26, 2019

(87) PCT Pub. No.: WO2018/077650
PCT Pub. Date: May 3, 2018

(65) Prior Publication Data
US 2019/0319531 A1    Oct. 17, 2019

(30) Foreign Application Priority Data
Oct. 27, 2016  (EP) .................................. 16196035

(51) Int. Cl.
*H02M 1/38*     (2007.01)
*H02M 7/539*    (2006.01)
*H03K 17/06*    (2006.01)

(52) U.S. Cl.
CPC ............ *H02M 1/38* (2013.01); *H02M 7/539* (2013.01); *H03K 17/063* (2013.01)

(58) Field of Classification Search
CPC .. H02M 7/538; H02M 7/5387; H02M 7/5375; H02M 7/5382; H02M 7/53846;
(Continued)

(56) References Cited

U.S. PATENT DOCUMENTS 5,546,043 A * 8/1996 Pollmeier ............. H02M 3/155
                                                    327/427
8,890,496 B2 * 11/2014 Inoue .................... H02M 3/158
                                                    323/271
(Continued)

FOREIGN PATENT DOCUMENTS

CN       1956305 A       5/2007
CN     203933395 U      11/2014
(Continued)

OTHER PUBLICATIONS

PCT International Search Report and Written Opinion of International Searching Authority dated Jan. 26, 2018 corresponding to PCT International Application No. PCT/EP2017/076335 filed Oct. 16, 2017.

*Primary Examiner* — Thienvu V Tran
*Assistant Examiner* — Nusrat Quddus
(74) *Attorney, Agent, or Firm* — Henry M. Feiereisen LLC

(57) ABSTRACT

A switching half-bridge has two field-effect transistors and a supplementary circuit arranged upstream of a gate terminal of a first field-effect transistor and formed of a first circuit branch having a damping resistor and an inductor connected in series with the damping resistor and a second circuit branch being connected in parallel with the first circuit branch and having a series resistor and an auxiliary switch connected in series with the series resistor. The half-bridge (Continued)

can be switched from a first switching state to a second switching state, wherein while the auxiliary switch is open, a change in the control voltage causes the first circuit branch to temporarily change the gate-source voltage of the first field-effect transistor from the switch-on level to a second switch-off level greater than a first switch-off level, with the gate-source voltage thereafter returning to the first switch-off level.

10 Claims, 5 Drawing Sheets

(58) Field of Classification Search
CPC .......... H02M 7/53806; H02M 7/5383; H02M 7/53835; H02M 7/53871
See application file for complete search history.

(56) References Cited

U.S. PATENT DOCUMENTS

| | | | |
|---|---|---|---|
| 8,994,437 B2* | 3/2015 | Hata | H03K 17/04123 327/376 |
| 9,590,616 B2* | 3/2017 | Inoue | H02M 1/08 |
| 9,634,553 B2* | 4/2017 | Roessler | B60L 3/003 |
| 9,800,245 B2* | 10/2017 | Dighrasker | H03K 17/08 |
| 10,135,426 B1* | 11/2018 | Li | H03K 17/04123 |
| 2004/0095790 A1* | 5/2004 | Bakran | H02M 7/487 363/132 |
| 2007/0096748 A1 | 5/2007 | Dearn et al. | |
| 2007/0115705 A1 | 5/2007 | Gotzenberger | |
| 2007/0195563 A1 | 8/2007 | Shiraishi | |
| 2008/0265975 A1 | 10/2008 | Takasu et al. | |
| 2010/0301921 A1* | 12/2010 | Isohata | H03K 17/166 327/427 |
| 2011/0285378 A1* | 11/2011 | Tamaoka | H02M 1/38 323/351 |
| 2013/0314020 A1* | 11/2013 | Sugie | H03K 3/012 318/503 |
| 2015/0137872 A1* | 5/2015 | Sugahara | H03K 17/168 327/391 |
| 2016/0094216 A1 | 3/2016 | Domes | |
| 2017/0222638 A1* | 8/2017 | Gariboldi | H03K 17/145 |
| 2019/0260304 A1* | 8/2019 | Ogawa | H01F 27/00 |

FOREIGN PATENT DOCUMENTS

| | | |
|---|---|---|
| CN | 105471417 A | 4/2015 |
| WO | WO 0137411 A2 | 5/2001 |
| WO | WO 2016030954 A1 | 3/2016 |

* cited by examiner

METHOD AND SWITCHING ARRANGEMENT FOR CHANGING A SWITCHING STATE OF A SWITCHING HALF-BRIDGE

CROSS-REFERENCES TO RELATED APPLICATIONS

This application is the U.S. National Stage of International Application No. PCT/EP2017/076335, filed Oct. 16, 2017, which designated the United States and has been published as International Publication No. WO 2018/077650 and which claims the priority of European Patent Application, Serial No. 16196035.6, filed Oct. 27, 2016, pursuant to 35 U.S.C. 119(a)-(d).

BACKGROUND OF THE INVENTION

The invention relates to a method and to a switching arrangement for changing a switching state of a switching half-bridge which has two field-effect transistors from a first switching state, in which a first field-effect transistor is switched on and the second field-effect transistor is switched off, to a second switching state, in which the first field-effect transistor is switched off and the second field-effect transistor is switched on.

The invention in particular relates to a method and to a switching arrangement for changing a switching state of a switching half-bridge which has two "WBG" field-effect transistors (WBG=wide-bandgap). A WBG field-effect transistor is taken to mean a field-effect transistor, the base material of which is a semiconductor with a wide bandgap (=energy gap between the valence band and conduction band) such as silicon carbide or gallium nitride. Due to their lower switching losses in comparison with the bipolar transistors with an insulated gate electrode (IGBT) which are frequently used, WBG field-effect transistors are in particular advantageously suitable for improving the power density of power converters such as pulse-controlled inverters or DC-DC converters. The switching frequency may thus be appreciably increased while maintaining identical switching losses, as a result of which the size of passive components in the system such as filters, transformers and link capacitors may be reduced.

At high switching speeds, parasitic repowering up of the field-effect transistor may occur when a field-effect transistor of a switching half-bridge is switched off. This effect is also known parasitic switching back on or "self turn-on". Due to a capacitive displacement current, the gate-source voltage between gate and source of the field-effect transistor which is being switched off is here briefly raised above the threshold voltage of the field-effect transistor, whereby the field-effect transistor becomes conductive again. This results in greatly increased switch-off losses of the field-effect transistor which is being switched off and switch-on losses of the complementary field-effect transistor which is being switched on of the switching half-bridge.

The object of the present invention is to provide a method and a switching arrangement for changing a switching state of a switching half-bridge which has two field-effect transistors, which method and arrangement are improved in particular with regard to avoidance of parasitic switching back on during switch-off of a field-effect transistor of the switching half-bridge

SUMMARY OF THE INVENTION

According to one aspect of the invention, the object is achieved by a method for changing a switching state of a switching half-bridge which has two field-effect transistors from a first switching state, in which a gate-source voltage of a first field-effect transistor adopts a switch-on level and a gate-source voltage of the second field-effect transistor adopts a first switch-off level, to a second switching state, in which the gate-source voltage of the first field-effect transistor adopts the first switch-off level and the gate-source voltage of the second field-effect transistor adopts the switch-on level. The gate-source voltage of the first field-effect transistor is here firstly changed from the switch-on level to a second switch-off level, the magnitude of which is greater than the magnitude of the first switch-off level. The gate-source voltage of the second field-effect transistor is then changed from the first switch-off level to the switch-on level. The gate-source voltage of the first field-effect transistor is thereafter changed from the second switch-off level to the first switch-off level.

Advantageous embodiments of the invention are the subject matter of the subclaims.

The inventive method thus provides, in the event of a changeover in the switching state of the switching half-bridge, temporarily changing the gate-source voltage of the (first) field-effect transistor which is being switched off to a (second) switch-off level which is increased in magnitude and switching on the other (second) field-effect transistor while the gate-source voltage of the field-effect transistor which is being switched off adopts this switch-off level which is increased in magnitude. This temporary change in the switch-off level of the gate-source voltage of the first field-effect transistor briefly increases the gap between the switch-off level and the threshold voltage of the first field-effect transistor for the duration of the commutation process, whereby parasitic switching back on of the first field-effect transistor is avoided. As a consequence, in the event of rapid switching of the field-effect transistors, any increase in switching losses due to parasitic switching back on of the respective field-effect transistor which is being switched off is advantageously avoided.

A first exemplary embodiment of the method provides that the gate-source voltage of the first field-effect transistor is changed from the switch-on level to the second switch-off level by changing a control voltage of the first field-effect transistor from the switch-on level to the second switch-off level. This exemplary embodiment thus provides bringing about the temporarily change in the switch-off level of the first field-effect transistor by a corresponding change in the control voltage of the first field-effect transistor.

One embodiment of the first exemplary embodiment of the method provides that a first duration is predetermined and that the gate-source voltage of the second field-effect transistor is changed from the first switch-off level to the switch-on level at a point in time which, in a time gap defined by the first duration, follows the change in control voltage of the first field-effect transistor from the switch-on level to the second switch-off level. Predetermining the first duration for the change in the gate-source voltage of the second field-effect transistor after the change in the control voltage of the first field-effect transistor makes it possible to define a suitable point in time for switching on the second field-effect transistor after switching off the first field-effect transistor.

A further embodiment of the first exemplary embodiment of the method provides that the gate-source voltage of the first field-effect transistor is changed from the second switch-off level to the first switch-off level by changing the control voltage of the first field-effect transistor from the second switch-off level to the first switch-off level. As a consequence, once the first field-effect transistor has switched off, the gate-source voltage of the first field-effect is changed back to the normal (first) switch-off level by the control voltage.

A further embodiment of the first exemplary embodiment of the method provides that a second duration is predetermined and that the gate-source voltage of the first field-effect transistor is changed from the second switch-off level to the first switch-off level at a point in time which, in a time gap defined by the second duration, follows the change in the gate-source voltage of the second field-effect transistor from the first switch-off level to the switch-on level. Predetermining the second duration for the change in the gate-source voltage of the first field-effect transistor makes it possible to define a suitable point in time for reducing the magnitude of the switch-off level from the raised value to the normal value.

A second exemplary embodiment of the method provides that, upstream of the gate terminal of the first field-effect transistor is arranged a supplementary circuit with an inductor which, in the event of a change in a control voltage of the first field-effect transistor from the switch-on level to the first switch-off level, brings about a temporary change in the gate-source voltage of the first field-effect transistor to the second switch-off level, and that, in order to change the gate-source voltage of the first field-effect transistor from the switch-on level to the second switch-off level, the control voltage of the first field-effect transistor is changed from the switch-on level to the first switch-off level. This exemplary embodiment thus provides bringing about the temporary increase in magnitude of the switch-off level of the first field-effect transistor by an additional inductor which is arranged upstream of the gate terminal of the first field-effect transistor. Together with the input capacitance of the first field-effect transistor, which is the sum of the capacitances between gate and source and between gate and drain of the first field-effect transistor, and a parasitic inductance of further components of the switching arrangement, said inductor acts as a series resonant circuit which is excited by a change hi the control voltage of the first field-effect transistor and brings about an overshoot of the gate-source voltage of the first field-effect transistor to the second switch-off level. As a consequence, in contrast with the first exemplary embodiment, the control voltage of the first field-effect transistor does not need to be changed temporarily to the second switch-off level hi order to change the switch-off level of the first field-effect transistor.

One embodiment of the second exemplary embodiment of the method provides that a duration is predetermined and that the gate-source voltage of the second field-effect transistor is changed from the first switch-off level to the switch-on level at a point in time which, in a time gap defined by the duration, follows the change hi control voltage of the first field-effect transistor from the switch-on level to the first switch-off level. The duration is here predetermined in such a manner that the second field-effect transistor is switched on by the change in the gate-source voltage thereof when the gate-source voltage of the first field-effect transistor adopts the second switch-off level.

According to another aspect of the invention, the object is achieved by a switching arrangement for changing a switching state of a switching half-bridge which has two field-effect transistors from a first switching state, in which a gate-source voltage of a first field-effect transistor adopts a switch-on level and a gate-source voltage of the second field-effect transistor adopts a first switch-off level, to a switching state, in which the gate-source voltage of the first field-effect transistor adopts the first switch-off level and the gate-source voltage of the second field-effect transistor adopts the switch-on level, has for each field-effect transistor a gate driver for driving the field-effect transistor with a control voltage and a supplementary circuit switchable between the gate driver and a gate terminal of the field-effect transistor. A gate-source voltage of the field-effect transistor is here adjustable by the gate driver and the supplementary circuit to the switch-on level, the first switch-off level and a second switch-off level, the magnitude of which is greater than the magnitude of the first switch-off level. The switching arrangement according to the invention makes it possible to carry out the method according to the invention with the advantages already stated above.

A first exemplary embodiment of the switching arrangement provides that each supplementary circuit has a supplementary gate driver for adjusting the control voltage to the first switch-off level and that the control voltage is adjustable with the gate driver to the switch-on level and the second switch-off level. This exemplary embodiment of the switching arrangement makes it possible to carry out the above-described first exemplary embodiment of the method according to the invention.

A second exemplary embodiment of the switching arrangement provides that each supplementary circuit has an inductor which, in the event of a change in the control voltage from the switch-on level to the first switch-off level, brings about a temporary change in the gate-source voltage of the respective field-effect transistor to the second switch-off level. This exemplary embodiment of the switching arrangement makes it possible to carry out the above-described second exemplary embodiment of the method according to the invention.

In all the exemplary embodiments of the method according to the invention and of the switching arrangement according to the invention, each field-effect transistor may be a WBG field-effect transistor, i.e. each field-effect transistor may have a wide-bandgap semiconductor, in particular silicon carbide, as base material. The invention is particularly advantageously suitable for switching half-bridges with WBG field-effect transistors, since the latter permit high switching speeds, in which parasitic switching back on of the respective field-effect transistor which is being switched off may occur.

A power converter according to the invention comprises at least one switching half-bridge which has two field-effect transistors and a switching arrangement according to the invention for changing a switching state of the switching half-bridge. The advantages of such a power converter are apparent from the advantages of the method according to the invention or of the switching arrangement according to the invention which have already been stated above.

BRIEF DESCRIPTION OF THE DRAWING

The above-described characteristics, features and advantages of this invention and the manner in which these are achieved will become more clearly and distinctly comprehensible from the following description of exemplary embodiments, which are explained in greater detail in connection with the drawings, in which.

DETAILED DESCRIPTION OF PREFERRED EMBODIMENTS

Figure 1:
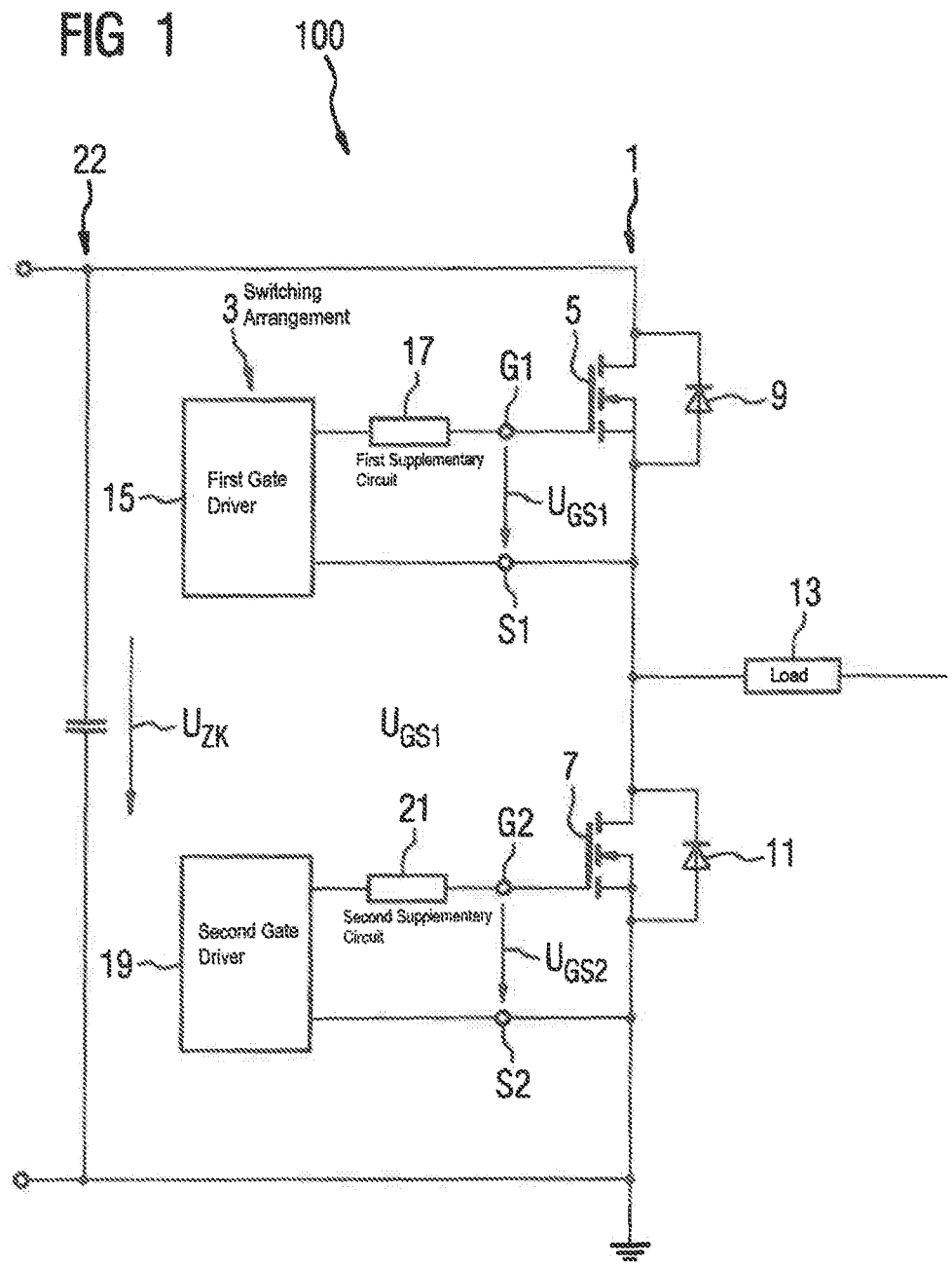
FIG. 1 shows a circuit diagram of a power converter with a switching half-bridge and of a switching arrangement for changing a switching state of the switching half-bridge.

Mutually corresponding parts are provided with the same reference characters in all the figures.

FIG. 1 shows a circuit diagram of a power converter 100 with a switching half-bridge 1 and a switching arrangement 3 for changing a switching state of the switching half-bridge 1. The power converter 100 takes the form of a single-phase pulse-controlled inverter.

The switching half-bridge 1 has a first field-effect transistor 5 and a second field-effect transistor 7, and optionally a first freewheeling diode 9 connected antiparallel to the first field-effect transistor 5 and a second freewheeling diode 11 connected antiparallel to the second field-effect transistor 7. The bridge branch of the switching half-bridge 1 is connected to a load 13.

The field-effect transistors 5, 7 are for example normally-off n-channel silicon carbide field-effect transistors, i.e. normally-off n-channel field-effect transistors whose base material is silicon carbide and whose threshold voltage at room temperature is between 1 V and 4 V.

The switching arrangement 3 has a first gate driver 15 and a first supplementary circuit 17 for driving the first field-effect transistor 5 and a second gate driver 19 and a second supplementary circuit 21 for driving the second field-effect transistor 7.

The switching half-bridge 1 is connected to a DC link 22, such that a DC link voltage $U_{ZK}$ of the DC link 22 is applied to the switching half-bridge 1.

Various exemplary embodiments of the switching arrangement 3 and the mode of operation thereof are described below with reference to FIGS. 2 to 5.

Figure 2:
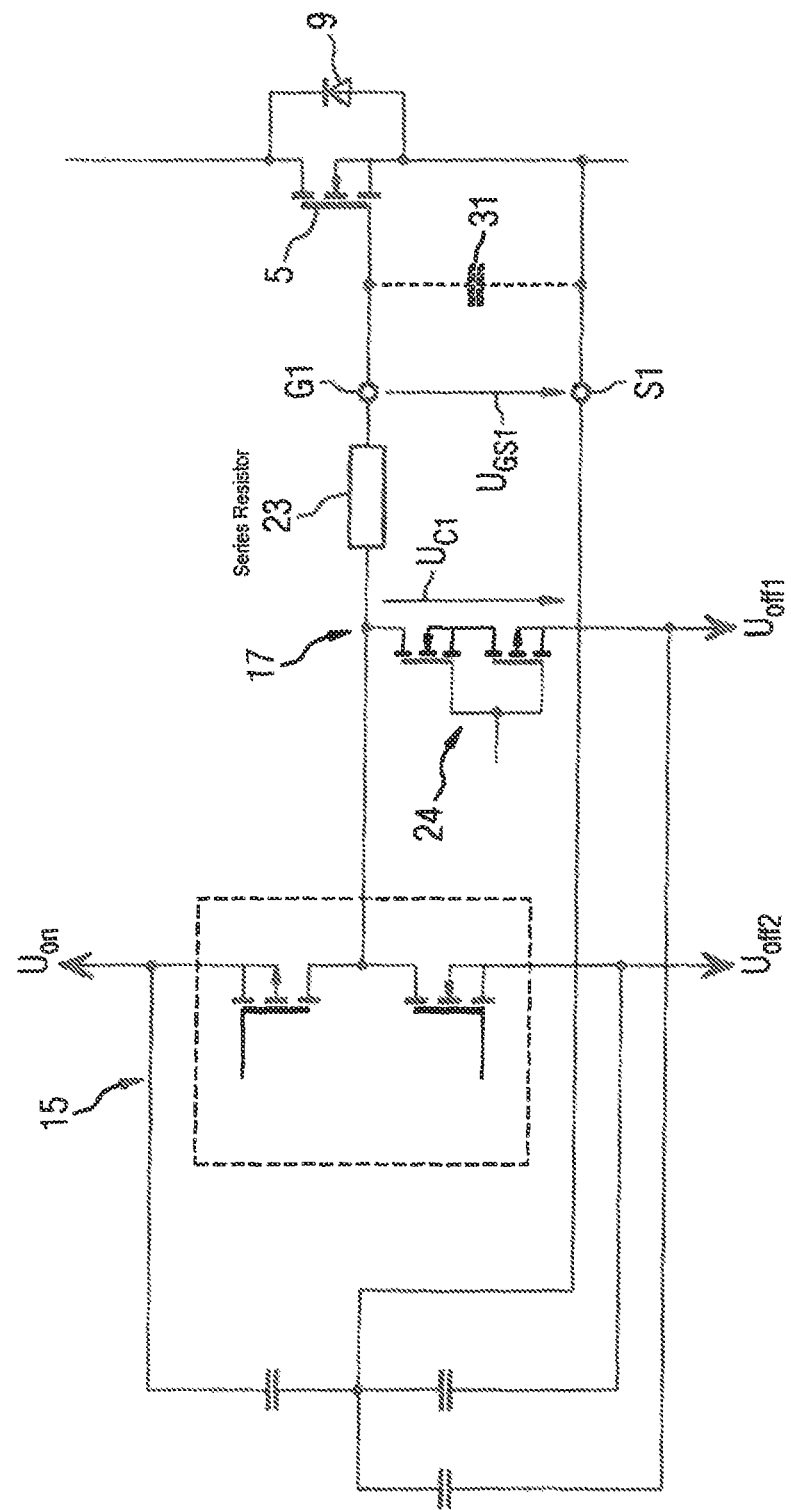
FIG. 2 shows a partial circuit diagram of a switching half-bridge and of a first exemplary embodiment of a switching arrangement for changing a switching state of the switching half-bridge.

FIG. 2 shows a first exemplary embodiment of a switching arrangement 3, wherein only the first gate driver 15 and the first supplementary circuit 17 for driving the first field-effect transistor 5 of the switching half-bridge 1 are shown. The second gate driver 19 and the second supplementary circuit 21 for driving the second field-effect transistor 7 of the switching half-bridge 1 are in each case constructed and switched in the same way as the first gate driver 15 and the first supplementary circuit 17. A series resistor 23 is located between a gate terminal G1, G2 of the respective field-effect transistor 5, 7 and the gate driver 15, 19 and the supplementary circuit 17, 21 of the field-effect transistor 5, 7.

Each supplementary circuit 17, 21 has a supplementary gate driver 24 for driving the respective field-effect transistor 5, 7. The first gate driver 15 and the supplementary gate driver 24 of the first supplementary circuit 17 generate a first control voltage $U_{C1}$ with which a gate-source voltage $U_{GS1}$ between the gate terminal G1 and a source terminal S1 of the first field-effect transistor 5 is controlled. The first control voltage $U_{C1}$ is adjustable to a first switch-off level $U_{off1}$ with the supplementary gate driver 24 of the first supplementary circuit 17. The first control voltage $U_{C1}$ is adjustable to a switch-on level $U_{on}$ or a second switch-off level $U_{off2}$ with the first gate driver 15, wherein the second switch-off level $U_{off2}$ has a greater magnitude than the first switch-off level $U_{off1}$. For field-effect transistors 5, 7 in the form of normally-off n-channel silicon carbide field-effect transistors, the first switch-off level $U_{off1}$ is for example between −3 V and −5 V, the second switch-off level $U_{off2}$ between −5 V and −10 V and the switch-on level $U_{on}$ between 15 V and 20 V.

The second gate driver 19 and the second supplementary circuit 21 accordingly generate a second control voltage $U_{C2}$ with which a gate-source voltage $U_{GS2}$ between the gate terminal G2 and a source terminal S2 of the second field-effect transistor 7 is controlled, wherein the second control voltage $U_{C2}$ is adjustable with the second supplementary circuit 21 to the first switch-off level $U_{off1}$ and with the second gate driver 19 to the switch-on level $U_{on}$ or the second switch-off level $U_{off2}$.

The switch-on level $U_{on}$ is a value of the gate-source voltages $U_{GS1}$, $U_{GS2}$ at which the respective field-effect transistor 5, 7 is switched on, i.e. conductive. The switch-off levels $U_{off1}$, $U_{off2}$ are values of the gate-source voltages $U_{GS1}$, $U_{GS2}$ at which the respective field-effect transistor 5, 7 is switched off, i.e. non-conductive.

Figure 3:
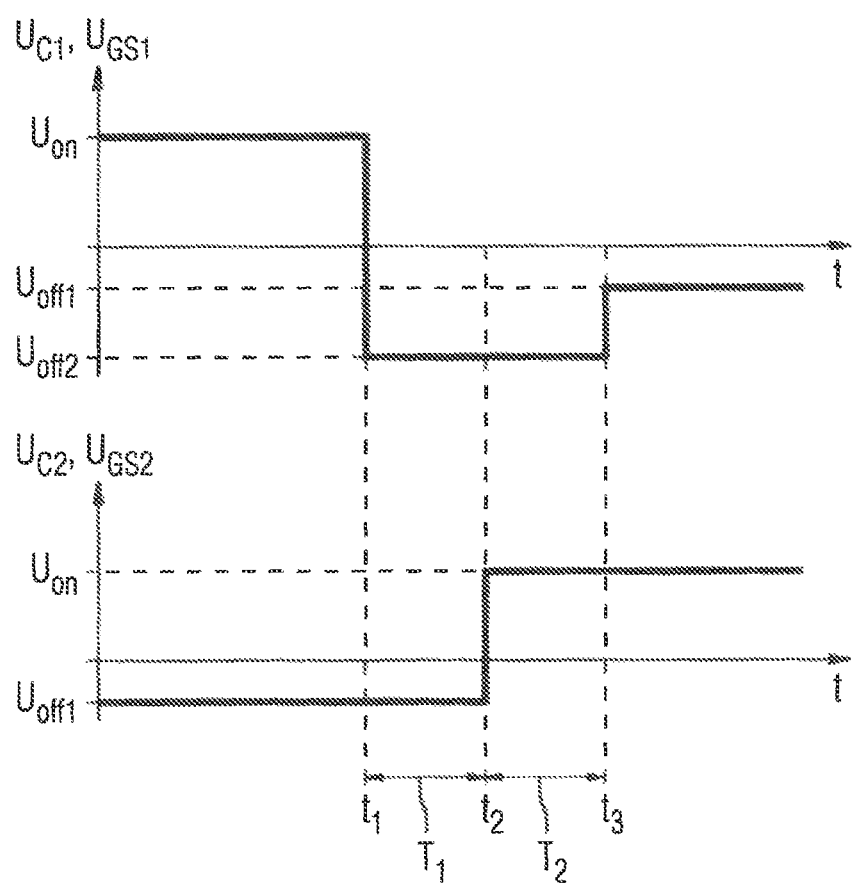
FIG. 3 shows time profiles of control voltages and gate-source voltages, generated by the switching arrangement shown in FIG. 2, of the field-effect transistors of a switching half-bridge.

FIG. 3 shows time profiles of control voltages $U_{C1}$, $U_{C2}$ generated with the switching arrangement 3 shown in FIG. 2 and of the consequently generated gate-source voltages $U_{GS1}$, $U_{GS2}$ of field-effect transistors 5, 7. The profiles of control voltages $U_{C1}$, $U_{C2}$ and gate-source voltages $U_{GS1}$, $U_{GS2}$ are shown as a function of a time t during changing according to the invention of a switching state of the switching half-bridge 1 from a first switching state, in which the first field-effect transistor 5 is switched on and the second field-effect transistor 7 is switched off, to a second switching state, in which the first field-effect transistor 5 is switched off and the second field-effect transistor 7 switched on. In the first switching state, the gate-source voltage $U_{GS1}$ of the first field-effect transistor 5 adopts the switch-on level $U_{on}$ and the gate-source voltage $U_{GS2}$ of the second field-effect transistor 7 adopts the first switch-off level $U_{off1}$. In the second switching state, the gate-source voltage $U_{GS1}$ of the first field-effect transistor 5 adopts the first switch-off level $U_{off1}$ and the gate-source voltage $U_{GS2}$ of the second field-effect transistor 7 adopts the first switch-on level $U_{on}$.

Starting from the first switching state, at a first point in time $t_1$, the first control voltage $U_{C1}$ is firstly changed by the first gate driver 15 from the switch-on level $U_{on}$ to the second switch-off level $U_{off2}$, wherein the supplementary gate driver 24 of the first supplementary circuit 17 remains switched off. Then, at a second point in time $t_2$, the second control voltage $U_{C2}$ is changed by the second gate driver 19 from the first switch-off level $U_{off1}$ to the switch-on level $U_{on}$, wherein the supplementary gate driver 24 of the second supplementary circuit 21 is switched off. Thereafter, at a third point in time $t_3$, the first control voltage $U_{C1}$ is changed by the supplementary gate driver 24 of the first supplementary circuit 17 from the second switch-off level $U_{off2}$ to the first switch-off level $U_{off1}$, wherein the first gate driver 15 is switched off. The gate-source voltage $U_{GS1}$ of the first field-effect transistor 5 here virtually instantaneously follows the first control voltage $U_{C1}$, such that the gate-source voltage $U_{GS1}$ of the first field-effect transistor 5 in FIG. 3 coincides with the first control voltage $U_{C1}$. The gate-source voltage $U_{GS2}$ of the second field-effect transistor 7 accordingly here virtually instantaneously follows the second control voltage $U_{C2}$, such that the gate-source voltage $U_{GS2}$ of the second field-effect transistor 7 in FIG. 3 coincides with the second control voltage $U_{C2}$. The second point in time $t_2$ and the third point in time $t_3$ are here established by a first duration $T_1$, which defines the time gap between $t_1$ and $t_2$, and a second duration $T_2$, which defines the time gap between $t_2$ and $t_3$, wherein the two durations $T_1$, $T_2$ are predetermined and definitively adjusted.

Figure 4:
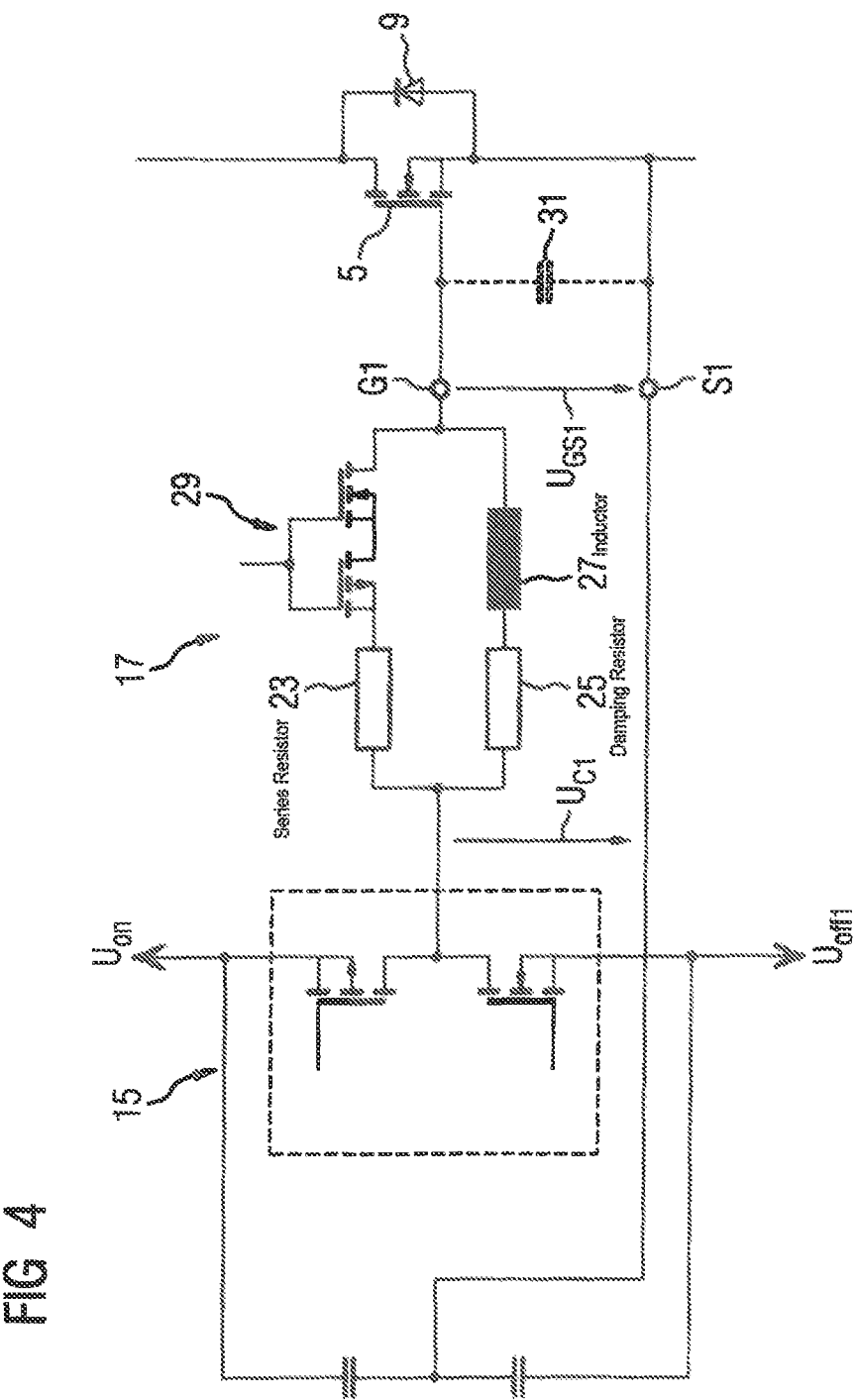
FIG. 4 shows a partial circuit diagram of a switching half-bridge and of a second exemplary embodiment of a switching arrangement for changing a switching state of the switching half-bridge.

FIG. 4 shows a second exemplary embodiment of a switching arrangement 3, wherein again only the first gate driver 15 and the first supplementary circuit 17 for driving the first field-effect transistor 5 of the switching half-bridge 1 are shown. The second gate driver 19 and the second supplementary circuit 21 for driving the second field-effect transistor 7 of the switching half-bridge 1 are in each case constructed and switched in the same way as the first gate driver 15 and the first supplementary circuit 17.

The first gate driver 15 generates a first control voltage $U_{C1}$ for controlling the gate-source voltage $U_{GS1}$ between a gate terminal G1 and a source terminal S1 of the first field-effect transistor 5. The second gate driver 19 accordingly generates a second control voltage $U_{C2}$ for controlling the gate-source voltage $U_{GS2}$ between a gate terminal G2 and a source terminal S2 of the second field-effect transistor 7.

Each supplementary circuit 17, 21 has two circuit branches connected parallel to one another, wherein a first circuit branch has a damping resistor 25 and an inductor 27 connected in series thereto and the second circuit branch has a series resistor 23 and an auxiliary switch 29.

The second circuit branch may be interrupted by opening the auxiliary switch 29, such that only the first circuit branch of the supplementary circuit 17, 21 is active. Together with an input capacitor 31 of the respective field-effect transistor 5, 7, which is the sum of the capacitances between gate and source and between gate and drain of the field-effect transistor 5, 7, and a parasitic inductance of further components of the switching arrangement 1, the first circuit branch then forms a series resonant circuit which is excited by changes in the respective control voltage $U_{C1}$, $U_{C2}$.

When the auxiliary switch 29 is closed, the effect of the series resonant circuit is suppressed and the respective supplementary circuit 17, 21 acts substantially like an ohmic resistor arranged upstream of the respective gate terminal G1, G2.

Figure 5:
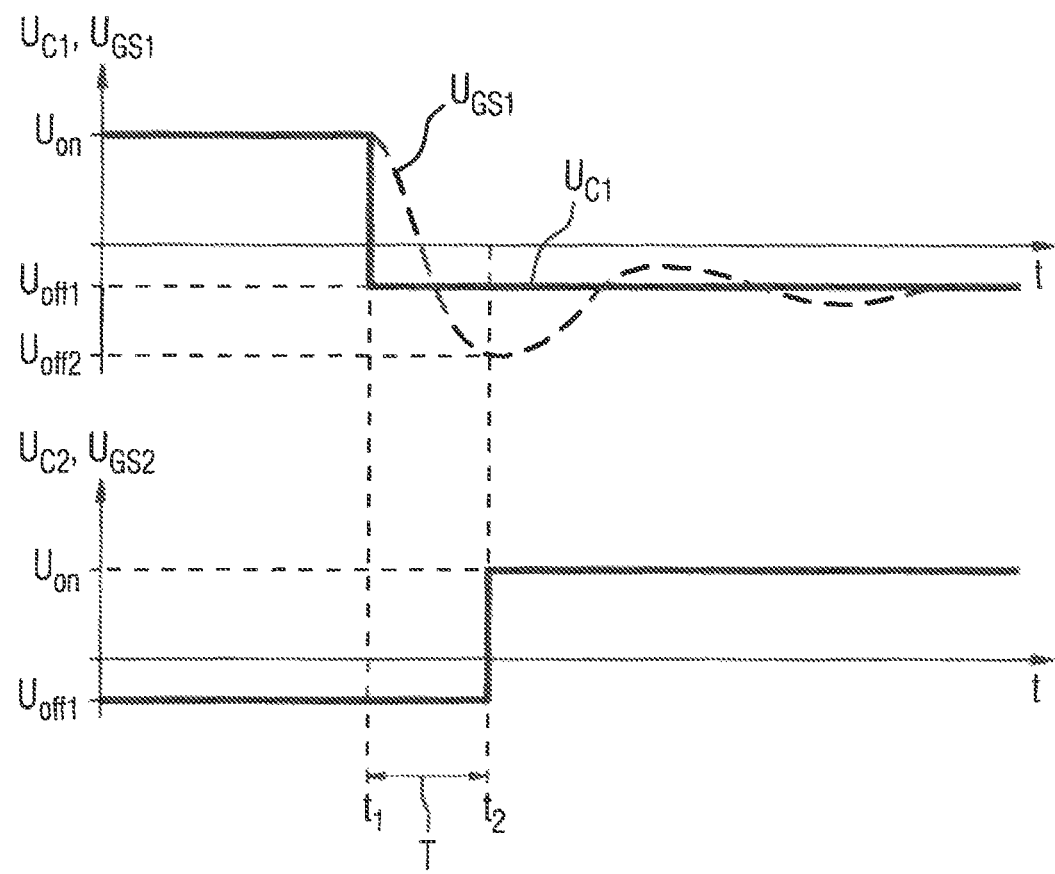
FIG. 5 shows time profiles of control voltages and gate-source voltages, generated by the switching arrangement shown in FIG. 4, of the field-effect transistors of a switching half-bridge.

FIG. 5 shows time profiles of control voltages $U_{C1}$, $U_{C2}$ generated with the switching arrangement 3 shown in FIG. 4 and of the consequently generated gate-source voltages $U_{GS1}$, $U_{GS2}$ of field-effect transistors 5, 7. The profiles of control voltages $U_{C1}$, $U_{C2}$ and gate-source voltages $U_{GS1}$, $U_{GS2}$ are shown as a function of a time t during changing according to the invention of a switching state of the switching half-bridge 1 from a first switching state, in which the first field-effect transistor 5 is switched on and the second field-effect transistor 7 is switched off, to a second switching state, in which the first field-effect transistor 5 is switched off and the second field-effect transistor 7 switched on. In the first switching state, the gate-source voltage $U_{GS1}$ of the first field-effect transistor 5 adopts the switch-on level $U_{on}$ and the gate-source voltage $U_{GS2}$ of the second field-effect transistor 7 adopts the first switch-off level $U_{off1}$. In the second switching state, the gate-source voltage $U_{GS1}$ of the first field-effect transistor 5 adopts the first switch-off level $U_{off1}$ and the gate-source voltage $U_{GS2}$ of the second field-effect transistor 7 adopts the first switch-on level $U_{on}$.

Starting from the first switching state, at a first point in time $t_1$, the first control voltage $U_{C1}$ is firstly changed by the first gate driver 15 from the switch-on level $U_{on}$ to the first switch-off level $U_{off1}$, wherein the auxiliary switch 29 of the first supplementary circuit 17 is opened, such that the first supplementary circuit 17, the input capacitor 31 of the first field-effect transistor 5 and the parasitic inductor of further components of the switching arrangement 1 form a series resonant circuit as described above. The damping resistor 25 and the inductor 27 of the supplementary circuit 17 are selected such that, after a duration T, the change in the first control voltage $U_{C1}$ from the switch-on level $U_{on}$, to the first switch-off level $U_{off1}$ brings about an overshoot of the gate-source voltage $U_{GS1}$ of the first field-effect transistor 5 up to the second switch-off level $U_{off2}$ and the gate-source voltage $U_{GS1}$ of the first field-effect transistor 5 then rapidly settles with damping to the first switch-off level $U_{off1}$. At a second point in time $t_2$, the second control voltage $U_{C2}$ is changed by the second gate driver 19 from the first switch-off level $U_{off1}$ to the switch-on level $U_{on}$, wherein the auxiliary switch 29 of the second supplementary circuit 21 is closed, such that the second supplementary circuit 21 substantially acts as an ohmic resistor arranged upstream of the gate terminal G2 of the second field-effect transistor 7 and the gate-source voltage $U_{GS2}$ of the second field-effect transistor 7 virtually instantaneously follows the second control voltage $U_{C2}$. The time gap between the second point in time and the first point in time $t_1$ is here defined by the duration T which is determined and definitively adjusted beforehand.

In both of the above-described exemplary embodiments, when the first field-effect transistor 5 is switched off, the gate-source voltage $U_{GS1}$ thereof is thus firstly reduced to the second switch-off level $U_{off2}$ before the second field-effect transistor 7 is switched on and the gate-source voltage $U_{GS1}$ of the first field-effect transistor 5 is adjusted to the first switch-off level $U_{off1}$ or the first switch-off level $U_{off1}$ is reached. This temporary reduction in the gate-source voltage $U_{GS1}$ advantageously prevents parasitic switching back on (self turn-on) of the first field-effect transistor 5 in the event of its being rapidly switched off.

In both of the above-described exemplary embodiments, changing of the switching state of the switching half-bridge 1 from the second switching state to the first switching state proceeds in a similar manner to the described changing of the switching state from the first switching state to the second switching state, wherein the gate driver 15, 19 and supplementary circuit 17, 21 merely swap their roles.

Although the invention has been illustrated and described in greater detail with reference to preferred exemplary embodiments, the invention is not limited by the disclosed examples and other variations may be derived therefrom by a person skilled in the art without going beyond the scope of protection of the invention.

The invention claimed is:

1. A method for changing a switching state of a switching half-bridge having two field-effect transistors and a supplementary circuit arranged upstream of a gate terminal of a first of the two field-effect transistors and formed of a first circuit branch having a damping resistor and an inductor connected in series with the damping resistor and a second circuit branch having a series resistor and an auxiliary switch connected in series with the series resistor, with the first circuit branch and the second circuit branch being connected in parallel, the method comprising:

switching from a first switching state, wherein a gate terminal of the first of the two field-effect transistors adapts a gate-source voltage corresponding to a switch-on level, and a second of the two field-effect transistors adapts a gate-source voltage corresponding to a first switch-off level, to a second switching state, wherein the gate-source voltage of the first of the two field-effect transistors adapts the first switch-off level, and the gate-source voltage of the second of the two field-effect transistors adapts the switch-on level, while the auxiliary switch is open, changing a control voltage of the first of the two field-effect transistors from the switch-on level to the first switch-off level; said changing of the control voltage causing the first circuit branch to temporarily change the gate-source voltage of the first of the two field-effect transistors from the switch-on level to a second switch-off level having a magnitude that is greater than a magnitude of first switch-off level, changing the gate-source voltage of the second of the two-effect transistors from the first switch-off level to the switch-on level; and changing the gate-source voltage of the first of the two field-effect transistors from the second switch-off level to the first switch-off level, wherein each of the two field-effect transistors comprises a wide-bandgap semiconductor base material.

2. The method of claim 1, further comprising changing the gate-source voltage of the second field-effect transistor from the first switch-off level to the switch-on level within a predetermined time following the change in the control voltage of the first field-effect transistor.

3. The method of claim 1, wherein the base material is silicon carbide.

4. A switching arrangement for changing a switching state of a switching half-bridge comprising two field-effect transistors, the switching arrangement comprising:

for each of the two field-effect transistors, a respective gate driver associated with the respective field-effect transistor and driving the respective field-effect transistor with a control voltage, for each of the two field-effect transistors, a supplementary circuit arranged between a gate terminal of the respective field-effect transistor and the respective gate driver, the supplementary circuit formed of a first circuit branch having a damping resistor and an inductor connected in series with the damping resistor and a second circuit branch having a series resistor and an auxiliary switch connected in series with the series resistor, said first circuit branch and second circuit branch connected in parallel, the respective gate driver in combination with the supplementary circuit switching the half-bridge from a first switching state, wherein the gate terminal of the first of the two field-effect transistors adapts a gate-source voltage corresponding to a switch-on level and the gate terminal of the second of the two field-effect transistors adapts a gate-source voltage corresponding to a first switch-off level, to a second switching state, wherein the gate-source voltage of the first of the two field-effect transistors adapts the first switch-off level, and the gate-source voltage of the second of the two field-effect transistors adapts the switch-on level, wherein, when the auxiliary switch is open, the respective control voltage of the first of the two field-effect transistors changes from the switch-on level to the first switch-off level; said change in the control voltage causing the first circuit branch to temporarily change the gate-source voltage of the first of the two field-effect transistors from the switch-on level to a second switch-off level having a magnitude that is greater than a magnitude of a first switch-off level, wherein the respective control voltage of the second of the two field-effect transistors then changes the gate-source voltage of the second of the two field-effect transistors from the first switch-off level to the switch-on level; and wherein the gate-source voltage of the first of the two field-effect transistors then changes from the second switch-off level to the first switch-off level.

5. The switching arrangement of claim 4, wherein each of the two field-effect transistors comprises a wide-bandgap semiconductor base material.

6. The switching arrangement of claim 5, wherein the base material is silicon carbide.

7. The switching arrangement of claim 4, wherein when the auxiliary switch is closed, the gate terminal of the first of the two field-effect transistors assumes substantially the control voltage determined by the second circuit branch, while suppressing an effect on the gate-source voltage resulting from the first circuit branch.

8. A power converter comprising a switching half-bridge which has two field-effect transistors and a switching arrangement for changing a switching state of a switching half-bridge, the switching arrangement comprising:

for each of the two field-effect transistors, a gate driver associated with the respective field-effect transistor and driving the respective field-effect transistor with a control voltage, for each of the two field-effect transistors, a supplementary circuit arranged between a gate terminal of the respective field-effect transistor and the gate driver, the supplementary circuit formed of a first circuit branch having a damping resistor and an inductor connected in series with the damping resistor and a second circuit branch having a series resistor and an auxiliary switch connected in series with the series resistor, said first circuit branch and second circuit branch connected in parallel, the gate driver in combination with the supplementary circuit switching the half-bridge from a first switching state, wherein the gate terminal of the first of the two field-effect transistors adapts a gate-source voltage corresponding to a switch-on level and the gate terminal of the second of the two field-effect transistors adapts a gate-source voltage corresponding to a first switch-off level, to a second switching state, wherein the gate-source voltage of the first of the two field-effect transistors adapts the first switch-off level, and the gate-source voltage of the second of the two field-effect transistors adapts the switch-on level, wherein, when the auxiliary switch is open, the respective control voltage of the first of the two field-effect transistors changes from the switch-on level to the first switch-off level; said change in the control voltage causing the first circuit branch to temporarily change the gate-source voltage of the first of the two field-effect transistors from the switch-on level to a second switch-off level having a magnitude that is greater than a magnitude of a first switch-off level, wherein the respective control voltage of the second of the two field-effect transistors then changes the gate-source voltage of the second of the two field-effect transistors from the first switch-off level to the switch-on level; and wherein the gate-source voltage of the first of the two field-effect transistors then changes from the second switch-off level to the first switch-off level.

9. A method for changing a switching state of a switching half-bridge having two field-effect transistors and a supplementary circuit arranged upstream of a gate terminal of a first of the two field-effect transistors and formed of a first circuit branch having a damping resistor and an inductor connected in series with the damping resistor and a second circuit branch having a series resistor and an auxiliary switch connected in series with the series resistor, with the first circuit branch and the second circuit branch being connected in parallel, the method comprising:

switching from a first switching state, wherein a gate terminal of the first of the two field-effect transistors adapts a gate-source voltage corresponding to a switch-on level, and a second of the two field-effect transistors adapts a gate-source voltage corresponding to a first switch-off level, to a second switching state, wherein the gate-source voltage of the first of the two field-effect transistors adapts the first switch-off level, and the gate-source voltage of the second of the two field-effect transistors adapts the switch-on level, while the auxiliary switch is open, changing a control voltage of the first of the two a field-effect transistors from the switch-on level to the first switch-off level; said changing of the control voltage causing the first circuit branch to temporarily change the gate-source voltage of the first of the two field-effect transistors from the switch-on level to a second switch-off level having a magnitude that is greater than a magnitude of a first switch-off level, changing the gate-source voltage of the second of the two field-effect transistors from the first switch-off level to the switch-on level; and changing the gate-source voltage of the first of the two field-effect transistors from the second switch-off level to the first switch-off level, wherein when the auxiliary switch is closed, the gate terminal of the first of the two field-effect transistors assumes substantially the control voltage determined by the second circuit branch, while suppressing an effect on the gate-source voltage resulting from the first circuit branch.

10. The method of claim 9, further comprising changing the gate-source voltage of the second field-effect transistor from the first switch-off level to the switch-on level within a predetermined time following the change in the control voltage of the first field-effect transistor.

* * * * *